(12) United States Patent
Wajima

(10) Patent No.: US 6,232,699 B1
(45) Date of Patent: May 15, 2001

(54) ENERGY-TRAP PIEZOELECTRIC RESONATOR AND ENERGY-TRAP PIEZOELECTRIC RESONANCE COMPONENT

(75) Inventor: Masaya Wajima, Shinminato (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/412,966

(22) Filed: Oct. 5, 1999

(30) Foreign Application Priority Data

Oct. 26, 1998 (JP) .................................................. 10-304461

(51) Int. Cl.[7] .................................................. H01L 41/08
(52) U.S. Cl. ............................................. 310/320; 310/365
(58) Field of Search ..................................... 310/358, 320, 310/365, 344, 348

(56) References Cited

U.S. PATENT DOCUMENTS

| | | | |
|---|---|---|---|
| 3,891,872 | * | 6/1975 | Nagata et al. .......................... 310/320 |
| 4,218,631 | * | 8/1980 | Yamaguchi ........................ 310/320 X |
| 4,870,313 | * | 9/1989 | Hirama et al. ......................... 310/320 |
| 5,194,836 | * | 3/1993 | Vale et al. .......................... 310/320 X |
| 5,689,220 | * | 11/1997 | Kaida ................................ 310/320 X |
| 5,925,968 | * | 7/1999 | Yachi et al. ............................ 310/320 |
| 5,969,463 | * | 10/1999 | Tomita et al. ......................... 310/320 |

* cited by examiner

*Primary Examiner*—Mark O. Budd
(74) *Attorney, Agent, or Firm*—Keating & Bennett, LLP

(57) ABSTRACT

An energy-trap piezoelectric resonator utilizing thickness extensional vibration includes a piezoelectric substrate and first and second resonance electrodes. The piezoelectric substrate is polarized in the thickness direction thereof and has first and second main surfaces. The first resonance electrode is partially disposed on the first main surface of the piezoelectric substrate, and the second resonance electrode is partially disposed on the second main surface of the piezoelectric substrate. The second resonance electrode is arranged to oppose the first resonance electrode with the piezoelectric substrate disposed therebetween and has an external dimension that is different from that of the first resonance electrode.

17 Claims, 15 Drawing Sheets

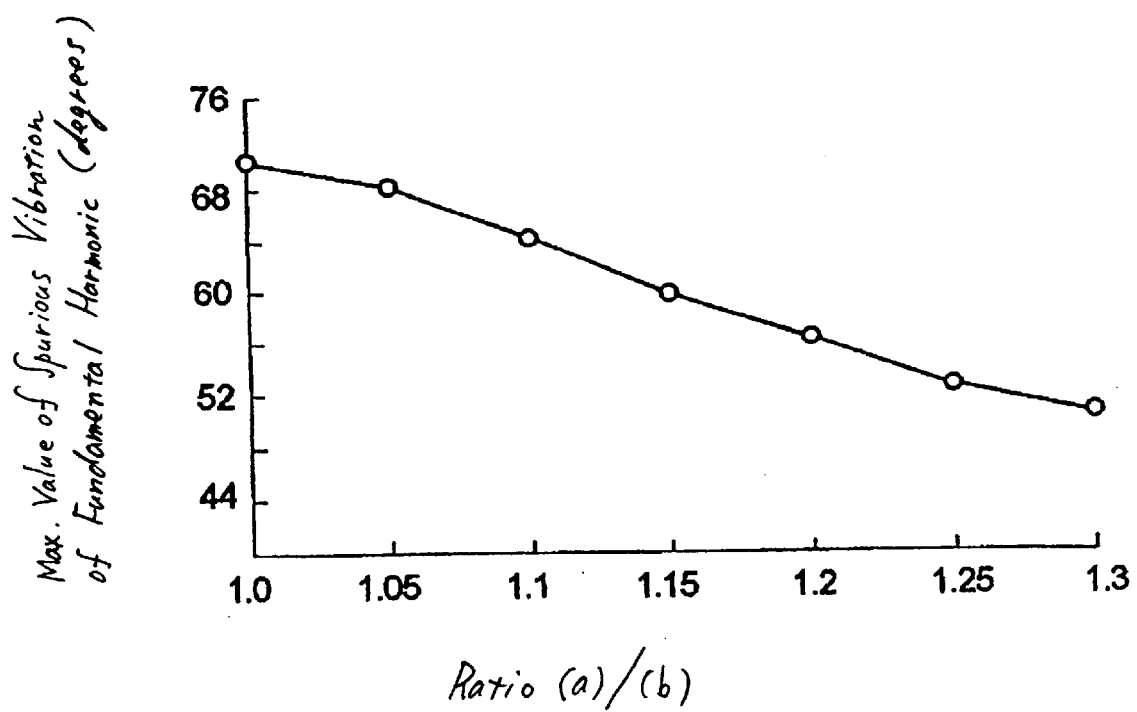

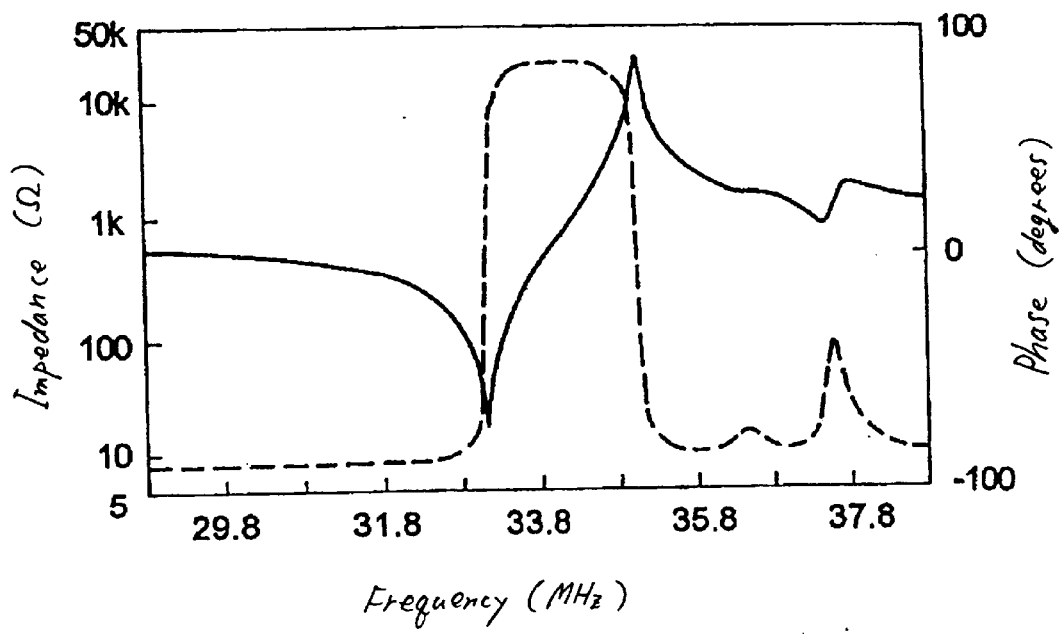
Fig. 8A Response to Third Harmonic ((a)/(b)=1.00)
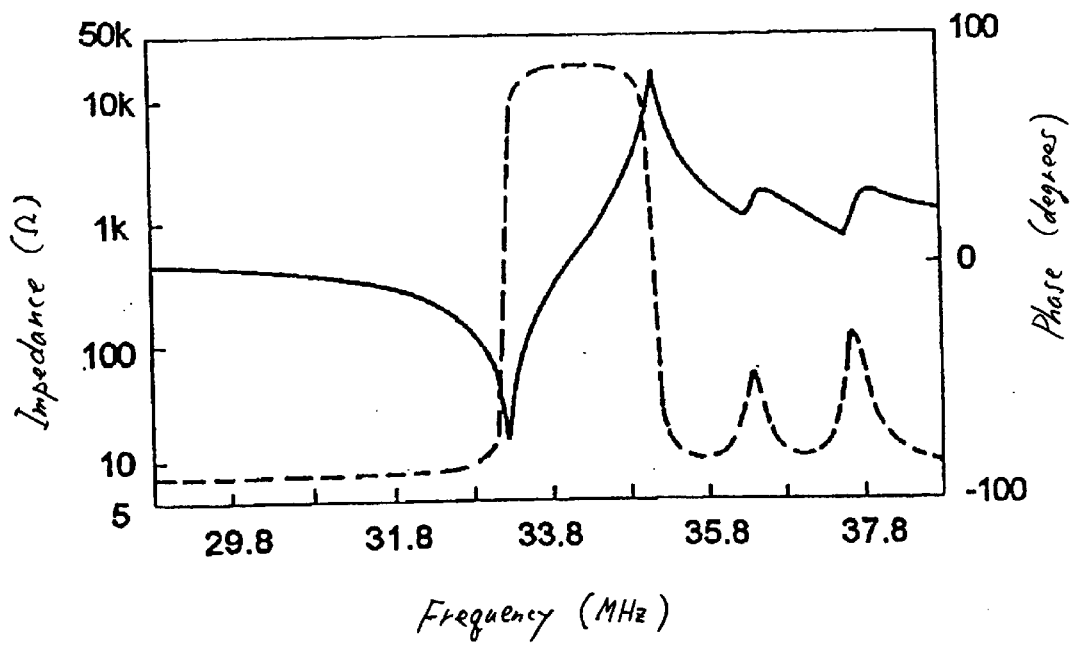
Fig. 8B Response to Third Harmonic ((a)/(b)=1.15)

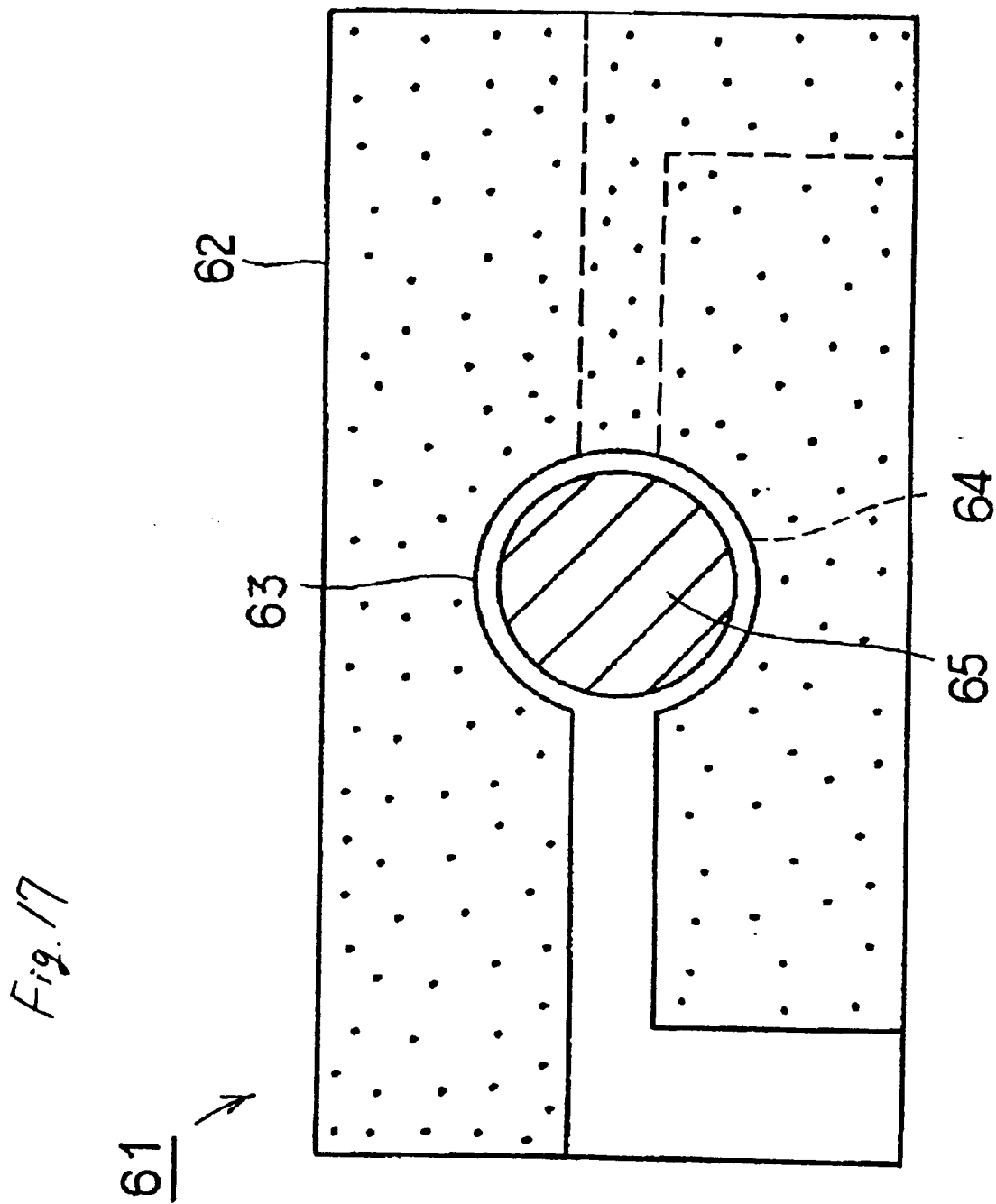

ENERGY-TRAP PIEZOELECTRIC RESONATOR AND ENERGY-TRAP PIEZOELECTRIC RESONANCE COMPONENT

BACKGROUND OF THE INVENTION

1. Field of the Invention

The present invention relates to an energy-trap piezoelectric resonator used as, for example, an oscillator or a band-pass filter, and more particularly, to an energy-trap piezoelectric resonator in which resonance electrodes disposed opposite to each other with a piezoelectric substrate located therebetween have improved shapes.

2. Description of the Related Art

Conventionally, an energy-trap piezoelectric resonator suitable for use in an oscillator operating in a MHz band uses a non-fundamental harmonic of a thickness extensional vibration mode. For example, Japanese Patent Application Laid-Open (kokai) No. 4-216208 discloses an energy-trap piezoelectric resonator as shown in FIG. 16.

An energy-trap piezoelectric resonator 51 shown in FIG. 16 uses a piezoelectric substrate 52 polarized in the thickness direction thereof. A resonance electrode 53 is disposed on the upper surface of the piezoelectric substrate 52 at the center thereof, while a resonance electrode 54 is disposed on the lower surface of the piezoelectric substrate 52 at the center thereof. The resonance electrodes 53 and 54 have circular shapes, are the same size, and are positioned opposite to each other with the piezoelectric substrate 52 disposed therebetween.

In the energy-trap piezoelectric resonator 51, the portion of the piezoelectric substrate 52 where the resonance electrodes 53 and 54 overlap each other constitutes a vibration portion. Upon application of an AC voltage to the resonance electrodes 53 and 54, thickness extensional vibration is generated in the resonator 51. Further, partial electrodes 55 are provided in order to utilize a non-fundamental harmonic of the thickness extensional vibration while lowering the response to the fundamental wave of the thickness extensional vibration. The partial electrodes 55 are disposed on the upper and lower surfaces of the piezoelectric substrate 52 so as to extend along the center portions of the corresponding longitudinal edges. Due to the mechanical load and the piezoelectric short-circuit effect created by the partial electrodes 55, vibration energy is attenuated, resulting in a decrease in the response to the fundamental wave of the thickness extensional vibration.

Meanwhile, Japanese Utility-Model Application Laid-Open (kokai) No. 5-25823 discloses a ceramic resonator as shown in FIG. 17. A ceramic resonator 61 of FIG. 17 utilizes the fundamental harmonic of thickness extensional vibration and has a structure in which circular resonance electrodes 63 and 64 having the same dimension are respectively disposed on the opposite main surfaces of a rectangular piezoelectric substrate 62. In the ceramic resonator, a circular resin layer 65 is disposed on the upper resonance electrode 63 such that the circular resin layer 65 has a diameter equal to or smaller than that of the resonance electrode 63.

The resin layer 65 is provided to produce a damping effect by means of its mass load, thereby suppressing ripples within a band to be used.

As described above, in the conventional energy-trap piezoelectric resonators, the resonance electrodes disposed on the opposite main surfaces of the piezoelectric substrate are typically of identical shape and size, and are positioned so that the resonance electrodes are opposite to and overlap each other in their entirety with the piezoelectric substrate disposed therebetween.

In energy-trap piezoelectric resonators of the above-described types, since vibrations other than vibration to be used are considered spurious vibrations, suppression of such spurious vibrations is strongly demanded.

In the prior art technique disclosed in Japanese Patent Application Laid-Open No. 4-216208, a non-fundamental harmonic of thickness extensional vibration is used, and the above-described partial electrodes 55 are used in order to suppress the fundamental harmonic of the thickness extensional vibration which is an undesired, spurious vibration. However, when the size of the piezoelectric resonator 51 is reduced, there is insufficient space for providing the partial electrodes 55. That is, use of the partial electrodes 55 makes miniaturization of the piezoelectric resonator difficult.

Further, in the energy-trap piezoelectric resonator disclosed in Japanese Utility-Model Application Laid-Open No. 5-25823, undesired vibrations are damped through attachment of a resin layer 65. However, when the resin layer 65 is applied, the vibration to be used is damped as well. Although not disclosed in Japanese Utility-Model Application Laid-Open No. 5-25823, when a resonator that utilizes a non-fundamental harmonic of thickness extensional vibration is constructed through use of the piezoelectric resonator 61, the harmonic of thickness extensional vibration is damped, causing it to be impossible to achieve good resonance characteristics.

In addition, in the case of the piezoelectric resonator 61, since the resin layer 65 must be applied in order to suppress undesired, spurious vibrations, the manufacturing process becomes overly complex.

SUMMARY OF THE INVENTION

To overcome the above-described problems, preferred embodiments of the present invention provide an energy-trap piezoelectric resonator which does not require formation of the above-described partial electrodes or resin layer, which effectively suppresses undesired vibration, which effectively generates a desired vibration mode, and which facilitates miniaturization of the resonator and simplification of the manufacturing process therefor.

One preferred embodiment of the present invention provides an energy-trap piezoelectric resonator adapted to vibrate in a thickness extensional vibration mode, including a piezoelectric substrate polarized in the thickness direction thereof and having first and second main surfaces, a first resonance electrode disposed on a portion of the first main surface of the piezoelectric substrate, and a second resonance electrode disposed on a portion of the second main surface of the piezoelectric substrate, the second resonance electrode being arranged to face the first resonance electrode with the piezoelectric substrate disposed therebetween and having an external dimension that is smaller than that of the first resonance electrode.

In the piezoelectric resonator of preferred embodiments of the present invention, since the external dimension of the second resonance electrode is smaller than that of the first resonance electrode, the fundamental harmonic of thickness extensional vibration easily leaks from the vibration portion. That is, the trap effect for the fundamental harmonic of thickness extensional vibration is set to a low level. Therefore, undesired, spurious vibrations resulting from the fundamental harmonic of thickness extensional vibration can be suppressed effectively. Thus, there is provided an energy-trap piezoelectric resonator which utilizes a non-fundamental harmonic of thickness extensional vibration and has excellent resonance characteristics.

Preferably, in the above described energy-trap piezoelectric resonator, a third harmonic of thickness extensional vibration is used. In this case, there is provided an energy-trap piezoelectric resonator which has excellent resonance characteristics resulting from the third harmonic of thickness extensional vibration and which is suitable for use in a MHz band.

Further, whereas conventional energy-trap piezoelectric resonators require the formation of partial electrodes or the application of a resin layer on the resonance electrode in order to suppress undesired spurious vibrations, the energy-trap piezoelectric resonator of preferred embodiments of the present invention does not require any excess member or element such as partial electrodes or a resin layer applied on the resonance electrode. Therefore, material costs are greatly reduced and the manufacturing process is greatly simplified in the preferred embodiments of the present invention.

In addition, in the conventional energy-trap piezoelectric resonators, formation of the partial electrodes makes miniaturization of the resonators difficult. In contrast, in preferred embodiments of the present invention, since no additional members or elements such as partial electrodes are required to be disposed around the vibration portion, the demand for miniaturizing resonators can be easily satisfied.

Preferably, in the above described energy-trap piezoelectric resonator, each of the first and second main surfaces of the piezoelectric substrate has a substantially rectangular flat shape, and the first and second resonance electrodes are arranged such that a relationship of $1.00<(a)/(b)<1.25$ is satisfied, where (a) is a dimension of the first electrode along a certain side of the substantially rectangular shape and (b) is a dimension of the second electrode along the certain side of the substantially rectangular shape.

In this case, in-band ripples stemming from harmonics of thickness extensional vibration are suppressed, and undesired spurious vibration resulting from the fundamental harmonic of thickness extensional vibration are suppressed effectively. Accordingly, there is provided an energy-trap piezoelectric resonator which utilizes a non-fundamental harmonic of thickness extensional vibration and has even more excellent resonance characteristics.

Preferably, in the above described energy-trap piezoelectric resonator, the first and second resonance electrodes have substantially circular shapes, and a relationship $1.00<(a)/(b)<1.25$ is satisfied, where (a) is a diameter of the first electrode and (b) is a diameter of the second electrode.

As in the above-described case, in-band ripples resulting from harmonics of thickness extensional vibration are suppressed and minimized, and undesired spurious vibration resulting from the fundamental harmonic of thickness extensional vibration is suppressed effectively. In addition, since the first and second resonance electrodes have substantially circular shapes, the first and second resonance electrodes are easily formed, and the ratio (a)/(b) can be controlled with ease.

Another preferred embodiment of the present invention provides an energy-trap piezoelectric resonance component, including the piezoelectric resonator according to the preferred embodiment described above, wherein first and second case substrates which are layered respectively on the first and second main surfaces of the piezoelectric resonator such that the first and second case substrates sandwich the piezoelectric resonator and thus define a laminated body, first and second terminal electrodes respectively disposed on opposite end surfaces of the laminated body and electrically connected to the first and second resonance electrodes, and a space is provided within the laminated body in order to allow free vibration of a vibration portion of the piezoelectric resonator where the first and second resonance electrodes face each other.

In this case, the first and second case substrates are layered on the energy-trap piezoelectric resonator of a preferred embodiment of the present invention, and the piezoelectric resonator is fixed to the first and second case substrates at portions surrounding the space for allowing free vibration of the vibration portion of the piezoelectric resonator. Therefore, a leaked fundamental harmonic of thickness extensional vibration can be effectively damped at the circumferential edge of the piezoelectric substrate, thereby providing an energy-trap piezoelectric resonance component having even more improved and excellent resonance characteristics.

Yet another preferred embodiment of the present invention provides an energy-trap piezoelectric resonance component including the piezoelectric resonator according to the preferred embodiment described above, and a case for accommodating the piezoelectric resonator, the case including a case body having an opening on one surface thereof and accommodating the piezoelectric resonator therein, and a plate-shaped case member fixed to the case body in order to close the opening of the case body.

Since the piezoelectric resonator of a preferred embodiment of the present invention is accommodated within a case including a case body and a plate-shaped case member, the energy-trap piezoelectric resonance component of preferred embodiments of the present invention can be provided in the same form as a conventional piezoelectric resonance component in which a piezoelectric resonator is accommodated within a case. In this case as well, the piezoelectric resonator can be joined to the case body or the case member via the circumferential edge of the piezoelectric substrate. That is, the piezoelectric resonator can be joined to the case body or the case member through a portion other than the vibration portion. Therefore, as in the case of the above-described energy-trap piezoelectric resonance component, the fundamental harmonic of thickness extensional vibration can be suppressed effectively at the joined portion.

BRIEF DESCRIPTION OF THE DRAWINGS

Various other elements, features, and many of the attendant advantages of the present invention will be readily appreciated as the same becomes better understood with reference to the following detailed description of preferred embodiments when considered in connection with accompanying drawings, in which:

FIG. 7 is a graph showing the relationship between the ratio (a)/(b) and the maximum value (phase value) of spurious vibration of the fundamental harmonic;

FIG. 8A is a graph of the impedance-frequency characteristic and phase-frequency characteristic showing the response to the third harmonic of thickness extensional vibration in an energy-trap piezoelectric resonator having the ratio (a)/(b)=1.00;

FIG. 8B is a graph of the impedance-frequency characteristic and phase-frequency characteristic showing the response to the third harmonic of thickness extensional vibration in an energy-trap piezoelectric resonator having the ratio (a)/(b)=1.15;

FIG. 17 is a perspective view of another conventional energy-trap piezoelectric resonator.

DETAILED DESCRIPTION OF PREFERRED EMBODIMENTS

The present invention will next be described in detail by way of examples, which should not be construed as limiting the present invention.

Figure 1A:
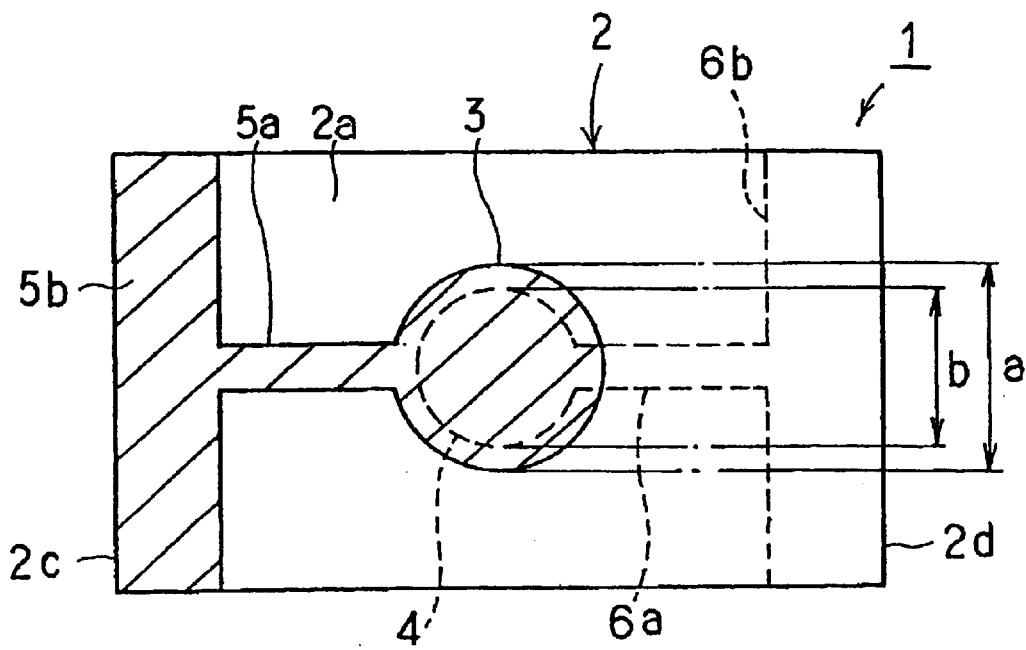
FIG. 1A is a plan view of an energy-trap piezoelectric resonator according to a first preferred embodiment of the present invention.
Figure 1B:
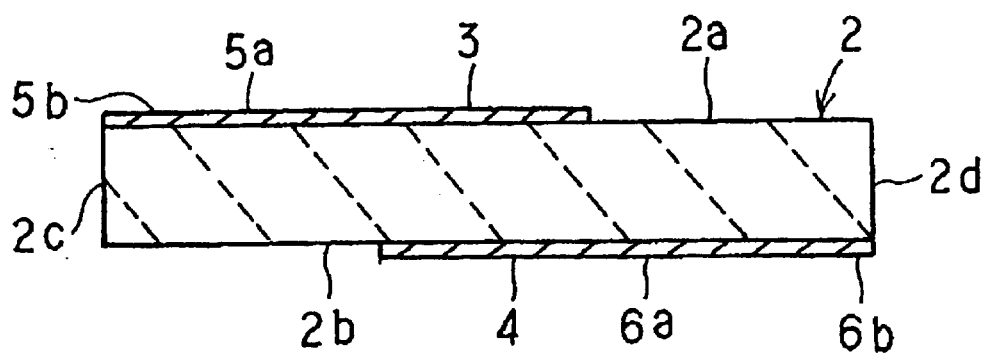
FIG. 1B is a front sectional view of the energy-trap piezoelectric resonator of FIG. 1A.

FIG. 1A is a plane view of an energy-trap piezoelectric resonator according to a first preferred embodiment of the present invention, and FIG. 1B is a front cross-sectional view of the energy-trap piezoelectric resonator.

An energy-trap piezoelectric resonator 1 preferably includes a substantially rectangular piezoelectric substrate 2. The piezoelectric substrate 2 is preferably formed of a piezoelectric ceramic such as lead titanate zirconate, or a piezoelectric single crystal such as $LiTaO_3$, $LiNbO_3$, or quartz.

When the piezoelectric substrate 2 is formed of a piezoelectric ceramic, it is polarized in its thickness direction.

A substantially circular first resonance electrode 3 is disposed at an approximate center portion of an upper surface 2a which defines a first main surface of the piezoelectric substrate 2.

A substantially circular second resonance electrode 4 is disposed at an approximate center portion of a lower surface 2b which defines a second main surface of the piezoelectric substrate 2. The second resonance electrode 4 faces the first resonance electrode 3 with the piezoelectric substrate 2 disposed therebetween. The diameter (b) of the second resonance electrode 4 is smaller than the diameter (a) of the first resonance electrode 3.

A connection conductive portion 5a and a lead-out electrode 5b are arranged to be continuous with the resonance electrode 3. The lead-out electrode 5b is disposed along the edge between the upper surface 2a and a side surface 2c of the piezoelectric substrate 2.

On the lower surface 2b of the piezoelectric substrate 2, a connection conductive portion 6a and a lead-out electrode 6b are arranged to be continuous with the resonance electrode 4. The lead-out electrode 6b is disposed along the edge between the lower surface 2b and a side surface 2d of the piezoelectric substrate 2.

In the piezoelectric resonator 1, upon application of an AC voltage between the resonance electrodes 3 and 4, thickness extensional vibration is generated. In the present preferred embodiment, the third harmonic of the thickness extensional vibration is preferably used. Accordingly, the material of the piezoelectric substrate 2, the size of the resonance electrodes 3 and 4, and other similar factors are selected in order to strongly generate the third harmonic of thickness extensional vibration.

Further, in the present preferred embodiment, since the diameter (a) of the resonance electrode 3 is greater than the diameter (b) of the resonance electrode 4, the fundamental harmonic of thickness extensional vibration is effectively suppressed. This effect occurs because the difference in diameter between the resonance electrodes 3 and 4 facilitates leakage of vibration energy to the peripheral portion of the vibration portion, and the fundamental harmonic of thickness extensional vibration leaks more easily than does the third harmonic of the thickness extensional vibration.

In order to confirm this phenomenon, the inventor of the present invention analyzed the vibration states of the third and fundamental harmonics of the thickness extensional vibration in the piezoelectric resonator 1 of the present preferred embodiment and confirmed that the energy of the fundamental harmonic of the thickness extensional vibration is trapped to a lesser extent than is the energy of the third harmonic and that the energy of the fundamental harmonic easily leaks to the periphery of the vibration portion.

Since the fundamental harmonic of the thickness extensional vibration easily leaks to the periphery of the vibration portion, theoretically, spurious vibrations resulting from the fundamental harmonic of the thickness extensional vibration are suppressed more effectively if the leaked fundamental harmonic of the thickness extensional vibration is damped.

Figure 2A:
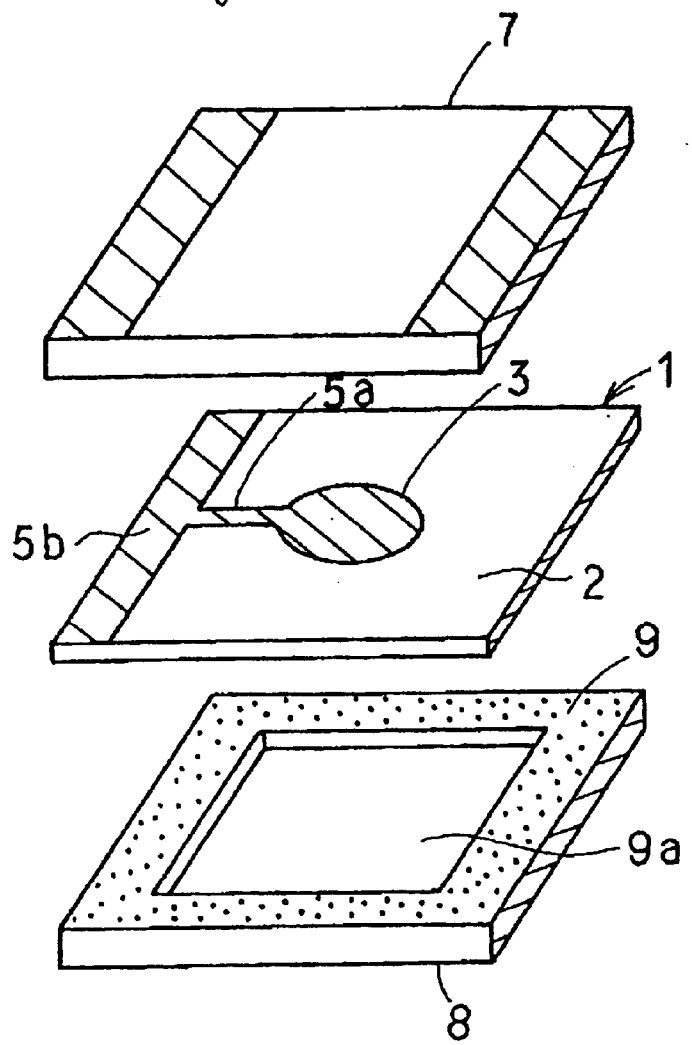
FIG. 2A is an exploded perspective view of a piezoelectric resonance component using the energy-trap piezoelectric resonator of the first preferred embodiment.

FIG. 2A is an exploded perspective view of a piezoelectric resonance component that is constructed in accordance with such a concept.

In the piezoelectric resonance component of the present preferred embodiment, first and second case substrates 7 and 8 are superposed on the upper and lower surfaces of the piezoelectric resonator 1 shown in FIG. 1. The case substrates 7 and 8 may be formed of an insulating ceramic, synthetic resin, or any other suitable material.

A layer of insulating adhesive 9 having a shape of a substantially rectangular frame is disposed on the lower surface of the case substrate 7 and on the upper surface of the case substrate 8. An opening 9a is formed in the adhesive layer 9 in order to form a sealed space which allows for free vibration of the vibration portion of the piezoelectric resonator 1.

A spacer having the shape of a substantially rectangular frame may be interposed between the piezoelectric resonator 1 and the case substrate 7 and between the piezoelectric resonator 1 and the case substrate 8. Further, a depression having the same horizontal cross section may be formed in each of the lower surface of the case substrate 7 and the upper surface of the case substrate 8 in order to provide the above-described sealed space.

Figure 2B:
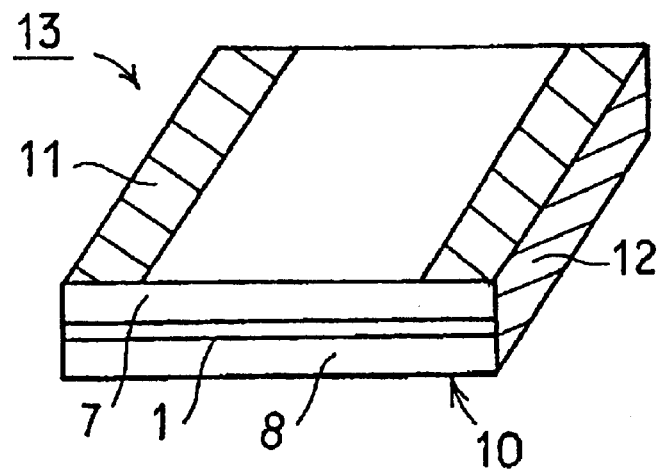
FIG. 2B is a perspective view showing the appearance of the piezoelectric resonance component of FIG. 2A.

When the piezoelectric resonator 1 and the case substrates 7 and 8 are bonded together via the adhesive layers 9, a laminated body 10 as shown in FIG. 2B is obtained. Terminal electrodes 11 and 12 are disposed on opposite end surfaces of the laminated body 10 so as to complete a piezoelectric resonance component 13 of the present preferred embodiment.

In the piezoelectric resonance component 13, since the peripheral edge of the piezoelectric substrate 2 of the piezoelectric resonator 1 is fixed via the adhesive layer 9, the leaked fundamental harmonic of thickness extensional vibration is effectively suppressed. That is, leakage of the fundamental harmonic of the thickness extensional vibration from the vibration portion is facilitated through formation of the resonance electrodes 3 and 4 having different diameters, and the leaked fundamental harmonic is suppressed by the adhesive layer 9. Accordingly, adverse effects stemming from the fundamental harmonic of thickness extensional vibration in a piezoelectric resonance component utilizing the third harmonic of thickness extensional vibration are suppressed and minimized.

In addition, in the piezoelectric resonator 1, since the diameter (a) of one resonance electrode 3 is greater than the diameter (b) of the other resonance electrode 4, there is reduced variation in characteristics which would otherwise be caused by a positional shift between the resonance electrodes 3 and 4 during production of the resonator 1. That is, even when a positional shift is produced between the approximate center of the resonance electrode 4 and the approximate center of the resonance electrode 3 during manufacture, the area in which the resonance electrodes 3 and 4 overlap each other does not change insofar as the peripheral edge of the resonance electrode 4 is located within a curve formed on the lower surface of the piezoelectric substrate 2 through projection of the resonance electrode 3.

Next, specific examples will be described in order to demonstrate that in the piezoelectric resonator 1 shown in FIG. 1, spurious vibrations caused by the fundamental harmonic of thickness extensional vibration are effectively suppressed, and that when the ratio (a)/(b) is set within a predetermined range, excellent resonance characteristics are obtained.

An energy-trap piezoelectric resonator of Example 1 was manufactured using a substantially rectangular piezoelectric substrate 2 formed of piezoelectric ceramic of a lead titanate zirconate type and having a size of approximately 2.5×2.0× 0.22 (thickness) mm. A substantially circular first resonance electrode 3 having a diameter of about 0.75 mm was disposed at the approximate center portion of the upper surface of the piezoelectric substrate 2, and a substantially circular second resonance electrode 4 having a diameter of about 0.65 mm was disposed at the approximate center portion of the lower surface of the piezoelectric substrate 2.

For comparison purposes, an energy-trap piezoelectric resonator of a conventional type was manufactured in the same manner as in Example 1 except that the diameters of the resonance electrodes provided on the opposite main surfaces of the piezoelectric substrate were set to 0.65 mm.

Figure 3:
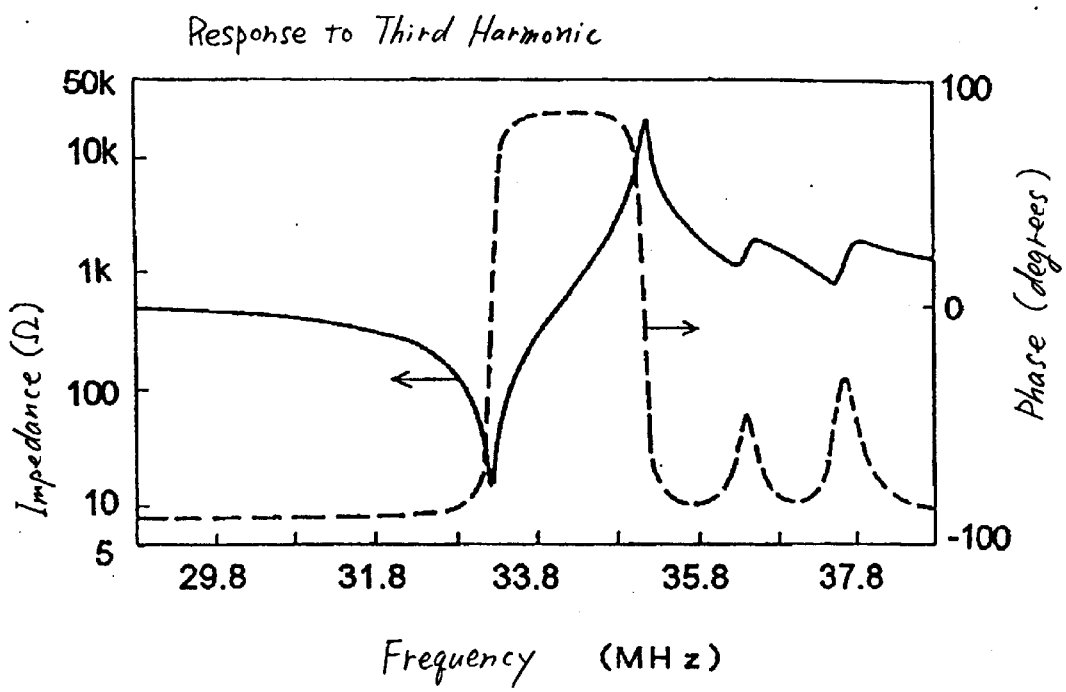
FIG. 3 is a graph of the impedance-frequency characteristic and phase-frequency characteristic showing the response to the third harmonic of thickness extensional vibration in an energy-trap piezoelectric resonator of Example 1.
Figure 4:
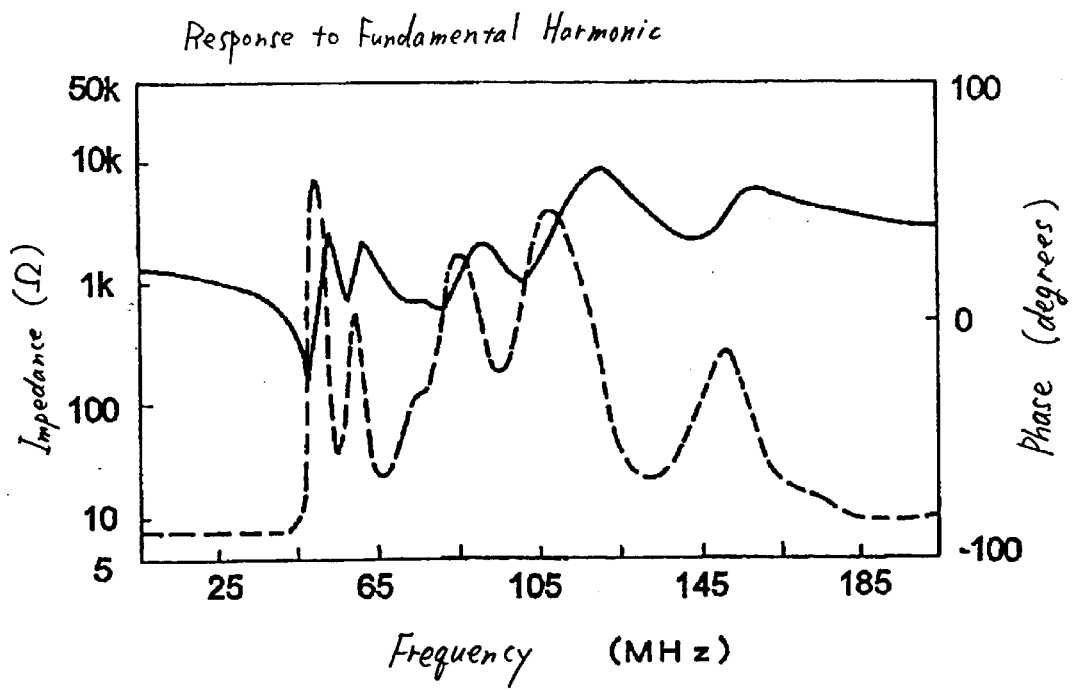
FIG. 4 is a graph of the impedance-frequency characteristic and phase-frequency characteristic showing the response to the fundamental harmonic of thickness extensional vibration in the energy-trap piezoelectric resonator of Example 1.

FIG. 3 shows the response to the third harmonic of thickness extensional vibration in the piezoelectric resonator of Example 1 thus manufactured, and FIG. 4 shows the response to the fundamental harmonic of the thickness extensional vibration which causes spurious vibrations.

Figure 5:
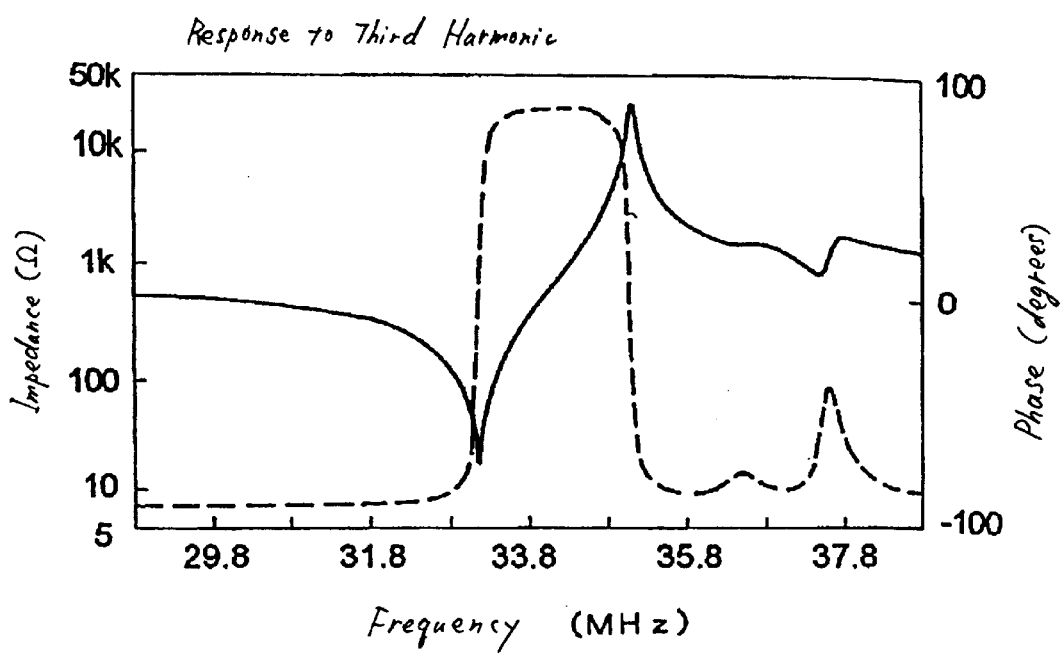
FIG. 5 is a graph of the impedance-frequency characteristic and phase-frequency characteristic showing the response to the third harmonic of thickness extensional vibration in a conventional energy-trap piezoelectric resonator.
Figure 6:
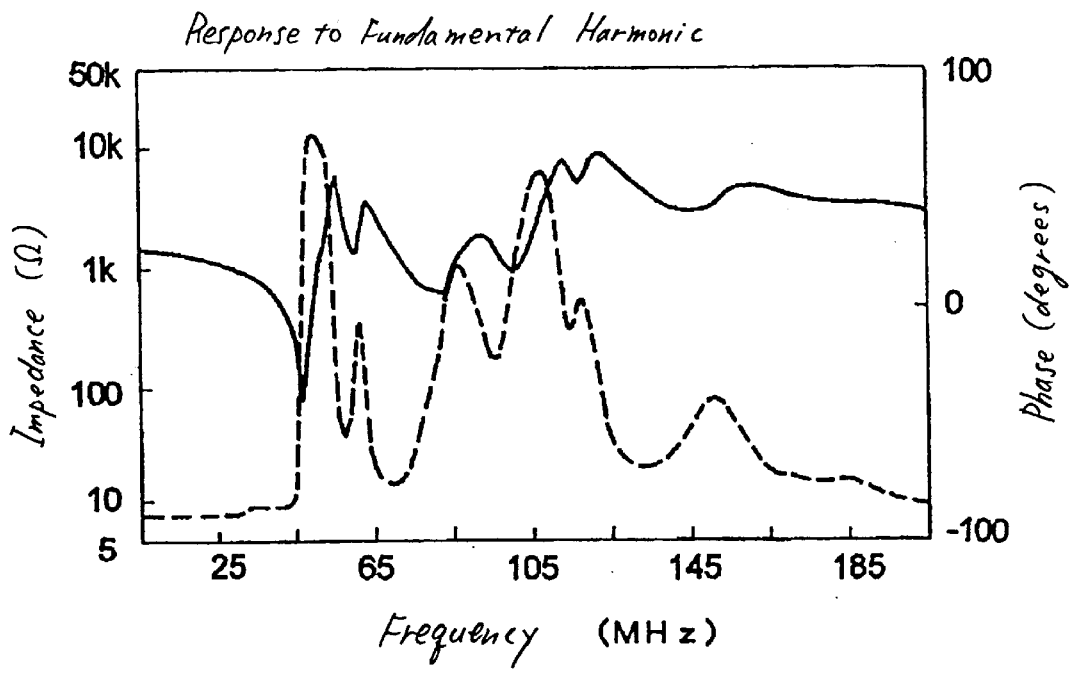
FIG. 6 is a graph of the impedance-frequency characteristic and phase-frequency characteristic showing the response to the fundamental harmonic of thickness extensional vibration in the conventional energy-trap piezoelectric resonator.

FIG. 5 shows the response to the third harmonic of thickness extensional vibration in the conventional energy-trap piezoelectric resonator manufactured in the above-described manner, and FIG. 6 shows the response to the fundamental harmonic of the thickness extensional vibration.

In each of FIGS. 3 to 6, a solid line represents an impedance-frequency characteristic, whereas a broken line represents a phase-frequency characteristic. The character "k" used for impedance values of the vertical axis in each of FIGS. 3 to 6 represents $10^3$.

As shown in FIG. 5, in the conventional piezoelectric resonator, the bottom-to-peak ratio; i.e., 20 log (antiresonance resistance/resonance resistance), in the impedance-frequency characteristic for the third harmonic of thickness extensional vibration is 64 dB. However, as shown in FIG. 6, spurious vibrations resulting from the fundamental harmonic are considerably large.

By contrast, in Example 1, as can be seen from the impedance-frequency characteristic for the third harmonic of thickness extensional vibration, the bottom-to-peak ratio is 64 dB, which is the same as that of the conventional product (see FIG. 3), and as shown in FIG. 4, the response to the fundamental harmonic of thickness extensional vibration is considerably lower.

Figure 9A:
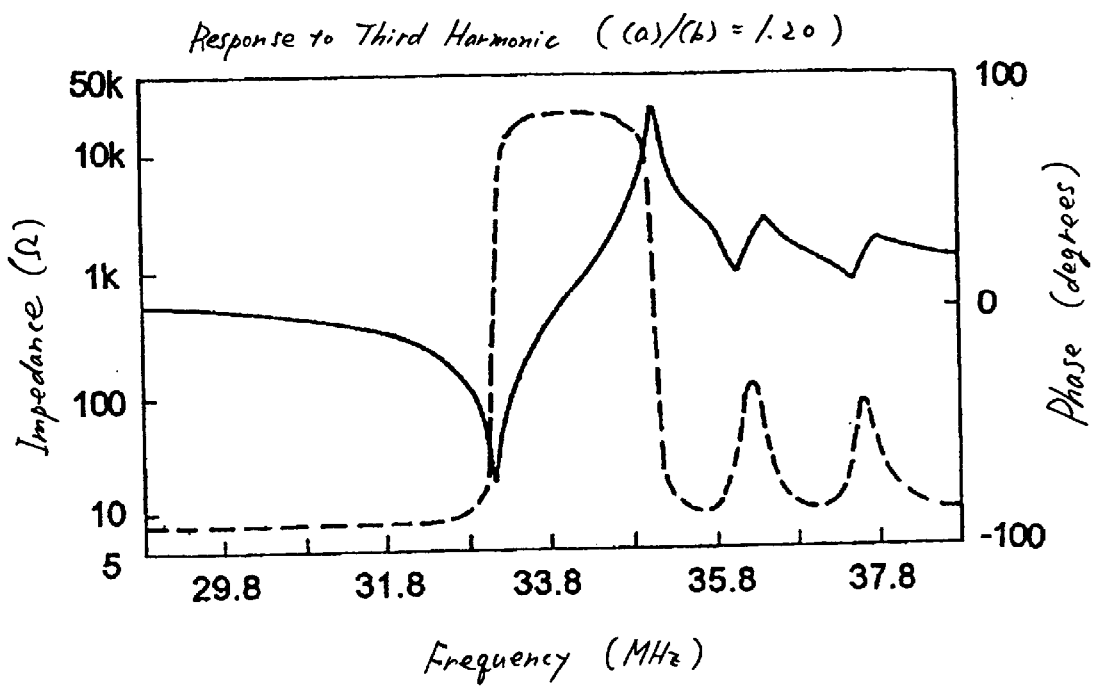
FIG. 9A is a graph of the impedance-frequency characteristic and phase-frequency characteristic showing the response to the third harmonic of thickness extensional vibration in an energy-trap piezoelectric resonator having the ratio (a)/(b)=1.20.
Figure 9B:
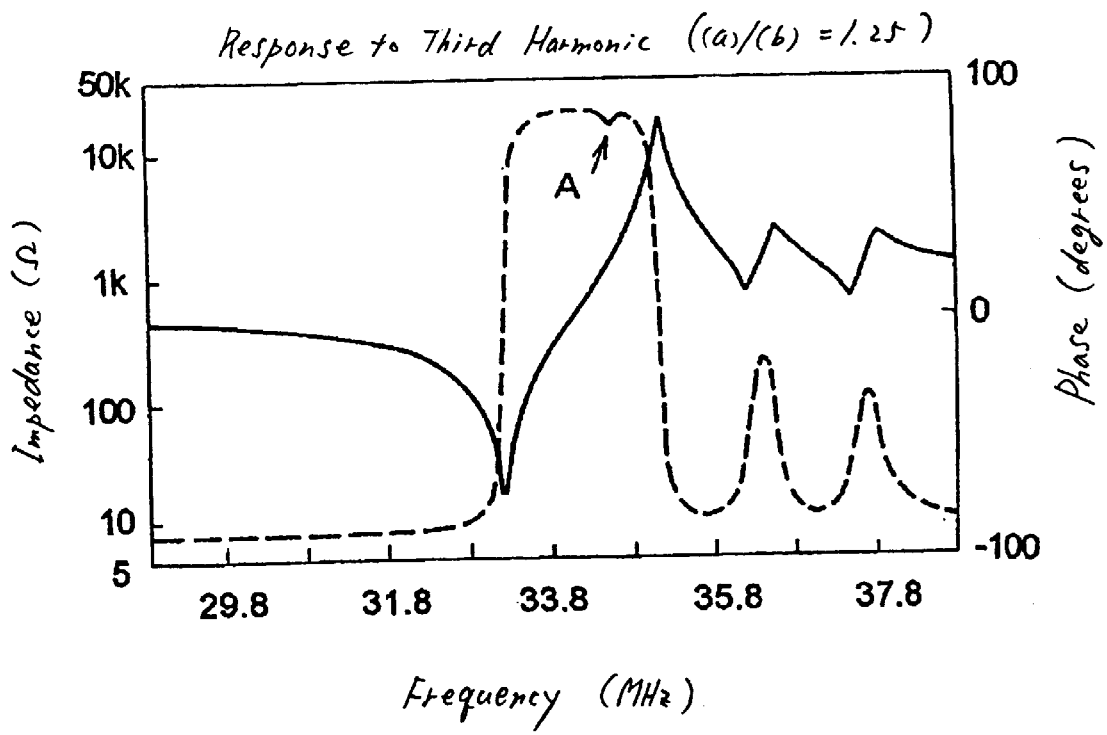
FIG. 9B is a graph of the impedance-frequency characteristic and phase-frequency characteristic showing the response to the third harmonic of thickness extensional vibration in an energy-trap piezoelectric resonator having the ratio (a)/(b)=1.25.
Figure 10:
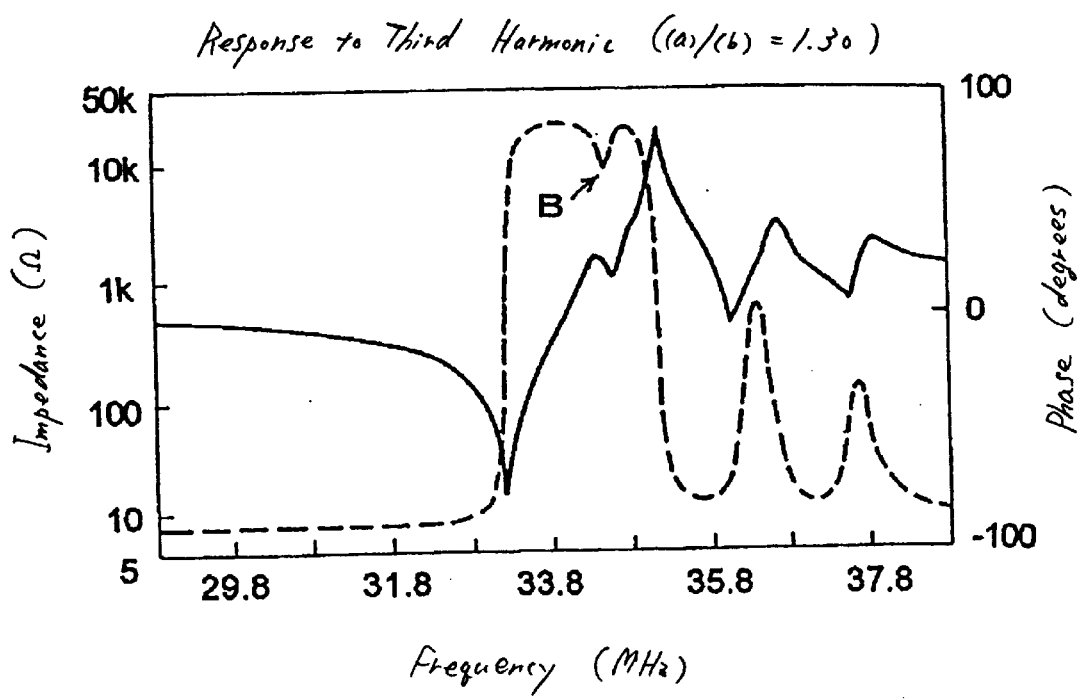
FIG. 10 is a graph of the impedance-frequency characteristic and phase-frequency characteristic showing the response to the third harmonic of thickness extensional vibration in an energy-trap piezoelectric resonator having the ratio (a)/(b)=1.30.

Further, various piezoelectric resonators were manufactured in the same manner as in Example 1, except that the diameter of the first resonance electrode 3 was changed within the range of about 0.65 to about 0.85 mm. That is, the diameter a of the first resonance electrode 3 was changed within the range of about 0.65 to about 0.85 mm in order to change the ratio (a)/(b) within the range of about 1 to about 1.3. The impedance-frequency characteristic and phase-frequency characteristic of each of the thus-manufactured piezoelectric resonators were measured. FIGS. 8 to 10 show the results of the measurement.

FIG. 8A is a graph of the impedance-frequency characteristic and phase-frequency characteristic showing the response to the third harmonic of thickness extensional vibration in an energy-trap piezoelectric resonator in which the ratio (a)/(b)=1.00, and FIG. 8B is a graph of the impedance-frequency characteristic and phase-frequency characteristic showing the response to the third harmonic of thickness extensional vibration in an energy-trap piezoelectric resonator in which the ratio (a)/(b)=1.15. Similarly, FIG. 9A is a graph of the impedance-frequency characteristic and phase-frequency characteristic showing the response to the third harmonic of thickness extensional vibration in an energy-trap piezoelectric resonator in which the ratio (a)/(b)=1.20, and FIG. 9B is a graph of the impedance-frequency characteristic and phase-frequency characteristic showing the response to the third harmonic of thickness extensional vibration in an energy-trap piezoelectric resonator in which the ratio (a)/(b)=1.25. FIG. 10 is a graph of the impedance-frequency characteristic and phase-frequency characteristic showing the response to the third harmonic of thickness extensional vibration in an energy-trap piezoelectric resonator in which the ratio (a)/(b)=1.30.

As is apparent from FIG. 9B, when the ratio (a)/(b)=1.25, a ripple indicated by arrow A is generated within a pass band. Further, as shown in FIG. 10, when the ratio (a)/(b)=1.30, a larger ripple indicated by arrow B is generated. Accordingly, as is apparent from-comparison among characteristics shown in FIGS. 8 to 10, when the third harmonic of thickness extensional vibration is utilized, the ratio (a)/(b) is preferably made less than about 1.25 in order to suppress the ripple within the pass band.

FIG. 7 shows the relationship between the ratio (a)/(b) and the magnitude of spurious vibration of the fundamental harmonic (the maximum value of phase caused by response to the fundamental harmonic in the phase-frequency characteristic) in each of the energy-trap piezoelectric resonators manufactured in the above-described manner. As is apparent from FIG. 7, when the ratio (a)/(b) exceeds about 1, the spurious vibration caused by the fundamental harmonic decreases as the ratio (a)/(b) increases. Accordingly, when the ratio (a)/(b) is set greater than about 1, or when the diameter (a) of the resonance electrode 3 is made greater than the diameter (b) of the resonance electrode 4, the spurious vibration caused by the fundamental harmonic is minimized.

Therefore, the ratio (a)/(b) is preferably set to satisfy a relationship 1.00<(a)/(b)<1.25 in order to effectively suppress the spurious vibration caused by the fundamental harmonic and to effectively suppress a ripple within a pass band which would otherwise be caused by the third harmonic of thickness extensional vibration.

In the energy-trap piezoelectric resonator 1 shown in FIG. 1, the connection conductive portions 5a and 6a connected to the substantially circular resonance electrodes 3 and 4 preferably have a width smaller than the diameter of the resonance electrodes 3 and 4. However, the shapes of the resonance electrodes and the connection conductive portions of the energy-trap piezoelectric resonator according to preferred embodiments of the present invention can be modified in various ways. Several modifications will be described with reference to FIGS. 11A, 11B, 12A, and 12B.

Figure 11A:
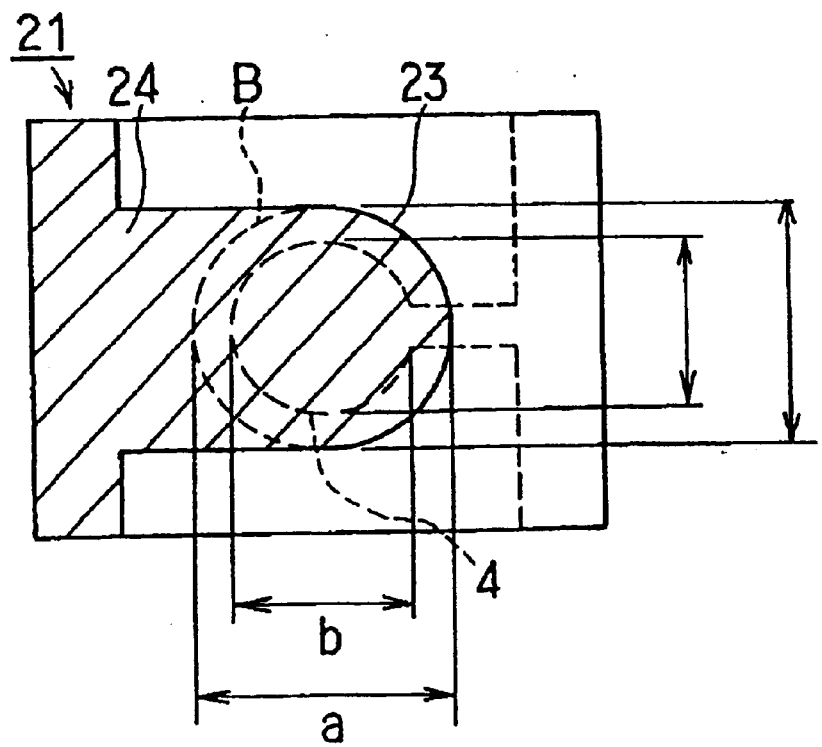
FIGS. 11A and 11B are plan views showing modifications of the energy-trap piezoelectric resonator according to preferred embodiments of the present invention.
Figure 11B:
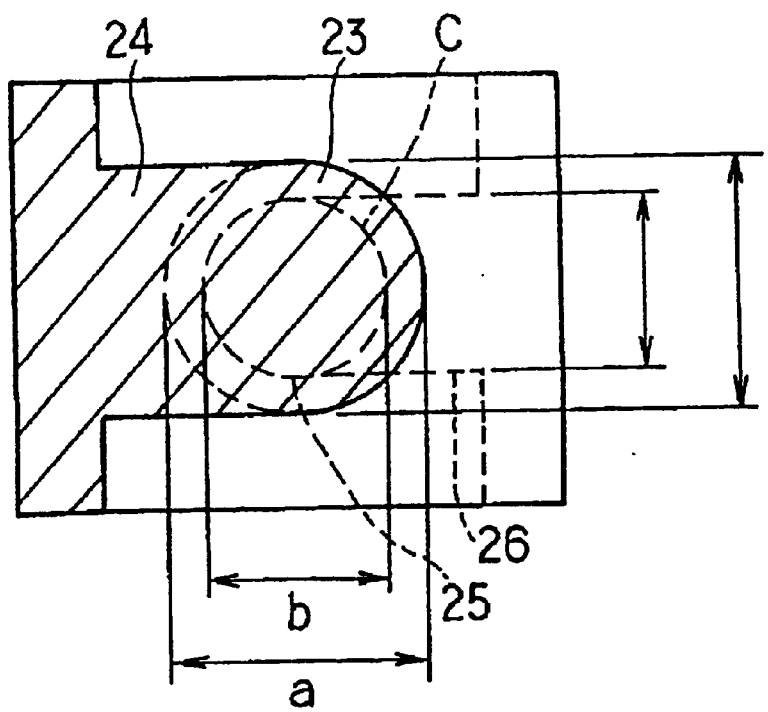

In an energy-trap piezoelectric resonator 21 according to one modification shown in FIG. 11A, a connection conductive portion 24 connected to a first resonance electrode 23 has a width that is substantially equal to the diameter of the resonance electrode 23. The other resonance electrode 4 is preferably configured in the same manner as in the resonance electrode 4 of the first preferred embodiment. Accordingly, the resonance electrode 23 can be considered to have an outer shape represented by the broken line B. In this case as well, when the ratio (a)/(b) is set within the above-described specific range, the fundamental harmonic of thickness extensional vibration and in-band ripples resulting from the third harmonic of thickness extensional vibration are effectively suppressed as in the first preferred embodiment.

The same consideration as that for the piezoelectric resonator 21 can be applied to the case where a connection conductive portion 26 connected to a resonance electrode 25 on the lower surface also has a width that is substantially equal to the diameter of the resonance electrode 25. That is, the resonance electrode 25 can be considered to have an outer shape represented by the broken line C. In this case, when the diameters (a) and (b) are set to be different from each other, spurious vibration stemming from the fundamental harmonic of thickness extensional vibration is effectively suppressed. Further, when the ratio (a)/(b) is set within the above-described specific range, in-band ripples are effectively suppressed as in the first preferred embodiment.

Figure 12A:
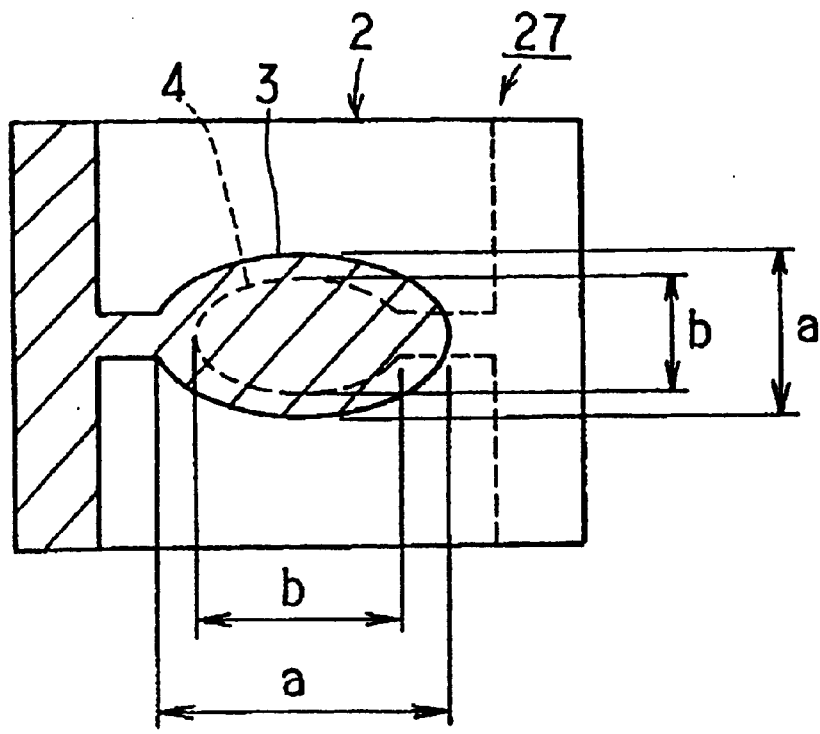
FIGS. 12A and 12B are plan views showing modifications of the energy-trap piezoelectric resonator according to preferred embodiments of the present invention.

In an energy-trap piezoelectric resonator 27 shown in FIG. 12A, each of the resonance electrodes 3 and 4 preferably has a substantially elliptical shape. In this case, the dimensions of the resonance electrodes 3 and 4 measured along one side of the piezoelectric substrate 2 are respectively regarded as the dimensions (a) and (b). In this case, the ratio (a)/(b) is preferably greater than about 1 and preferably falls within the above-described range in both the case where the dimensions (a) and (b) of the resonance electrodes 3 and 4 are measured along a longer side of the piezoelectric substrate 2 and the case where the dimensions (a) and (b) of the resonance electrodes 3 and 4 are measured along a shorter side of the piezoelectric substrate 2.

Figure 12B:
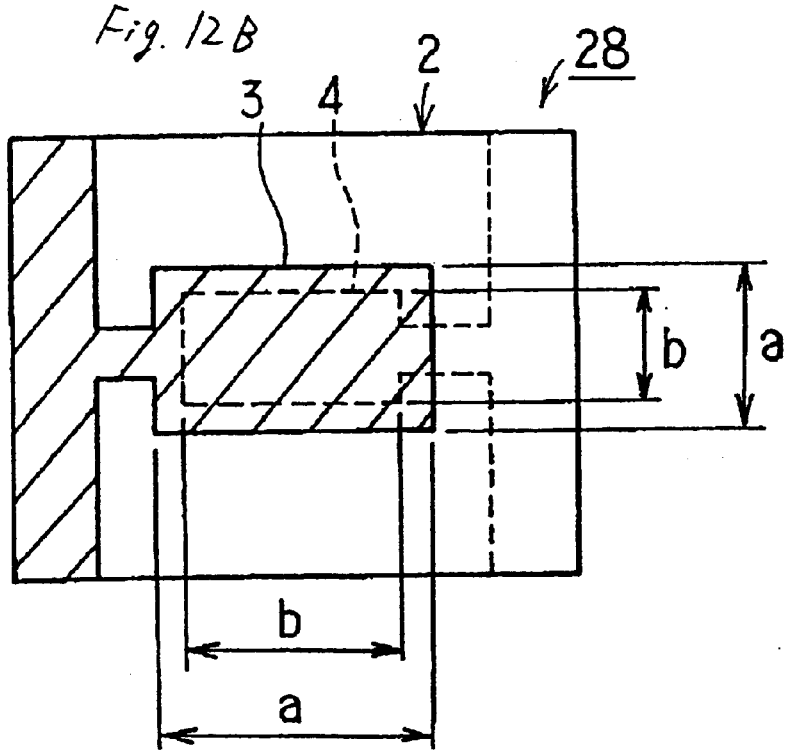

Further, in an energy-trap piezoelectric resonator 28 shown in FIG. 12B, each of the resonance electrodes 3 and 4 preferably has a substantially rectangular shape. In this case, the dimensions of the resonance electrodes 3 and 4 measured along a longer side or shorter side of the substantially rectangular piezoelectric substrate 2 are respectively regarded as the dimensions (a) and (b), based on which the ratio (a)/(b) is set.

In the piezoelectric resonance component shown in FIG. 2, the case substrates 7 and 8 are layered on the upper and lower surfaces of the piezoelectric resonator 1. However, the piezoelectric resonance component of preferred embodiments of the present invention may be modified in various ways in terms of the structure of the case.

Figure 13:
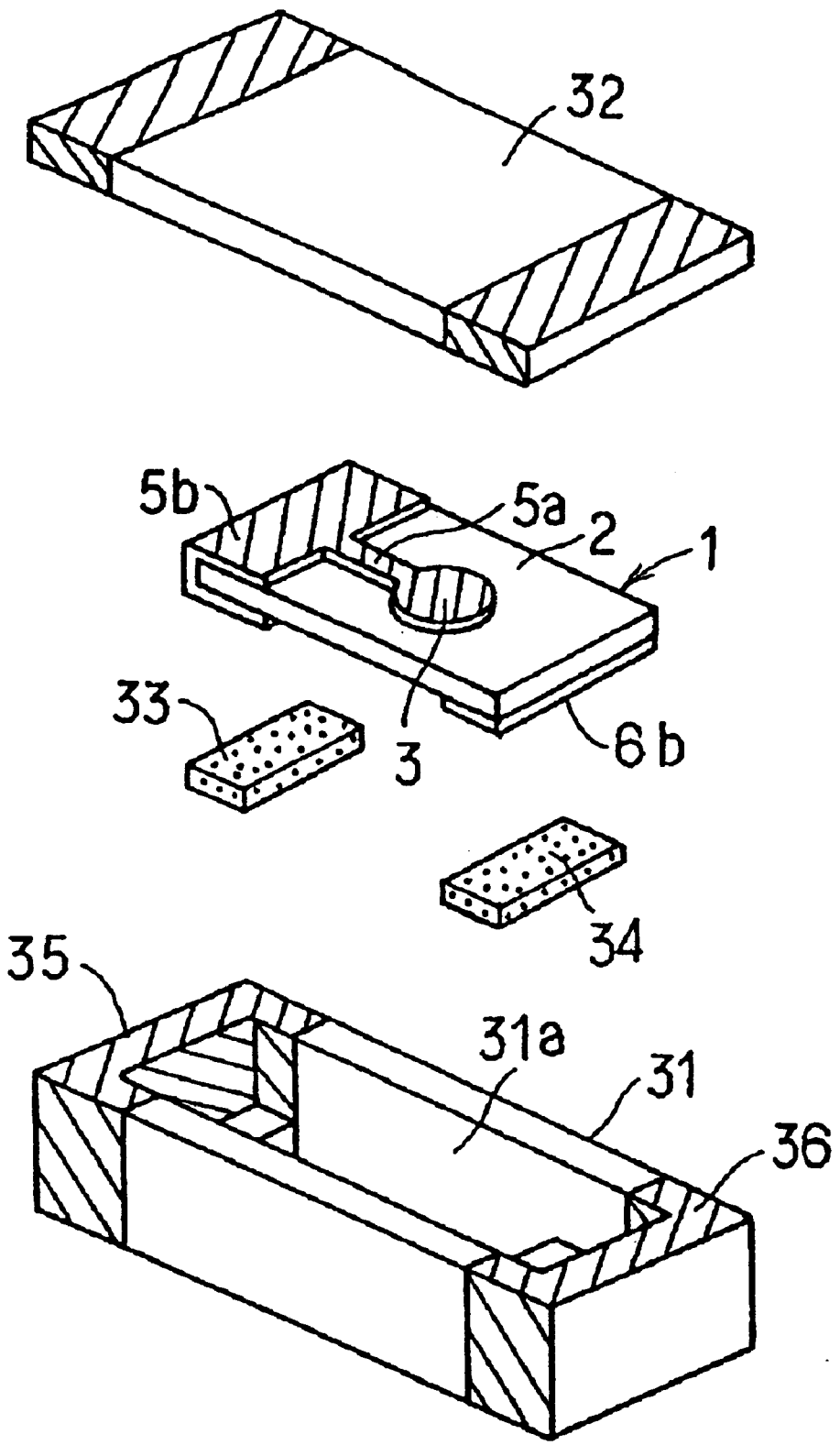
FIG. 13 is an exploded perspective view showing a modification of the energy-trap piezoelectric resonance component according to preferred embodiments of the present invention.

In a piezoelectric resonance component according to a modified preferred embodiment shown by an exploded perspective view of FIG. 13, the case is composed of a case body 31 and a plate-shaped case member 32. The case body 31 has an opening 31a at the upper side. The case member 32 is fixed to the case body 31 such that it covers the opening 31a. The piezoelectric resonator 1 is placed inside of the case body 31 through the opening 31a and fixed thereto via conductive adhesive layers 33 and 34. The adhesive layers 33 and 34 further provide a function of electrically connecting the resonance electrodes 3 and 4 of the piezoelectric resonator 1 to terminal electrodes 35 and 36 disposed on the case body 31.

The piezoelectric resonator 1 is sealed within the case by joining the case member 32 to the case body 31 with conductive adhesive.

Figure 14:
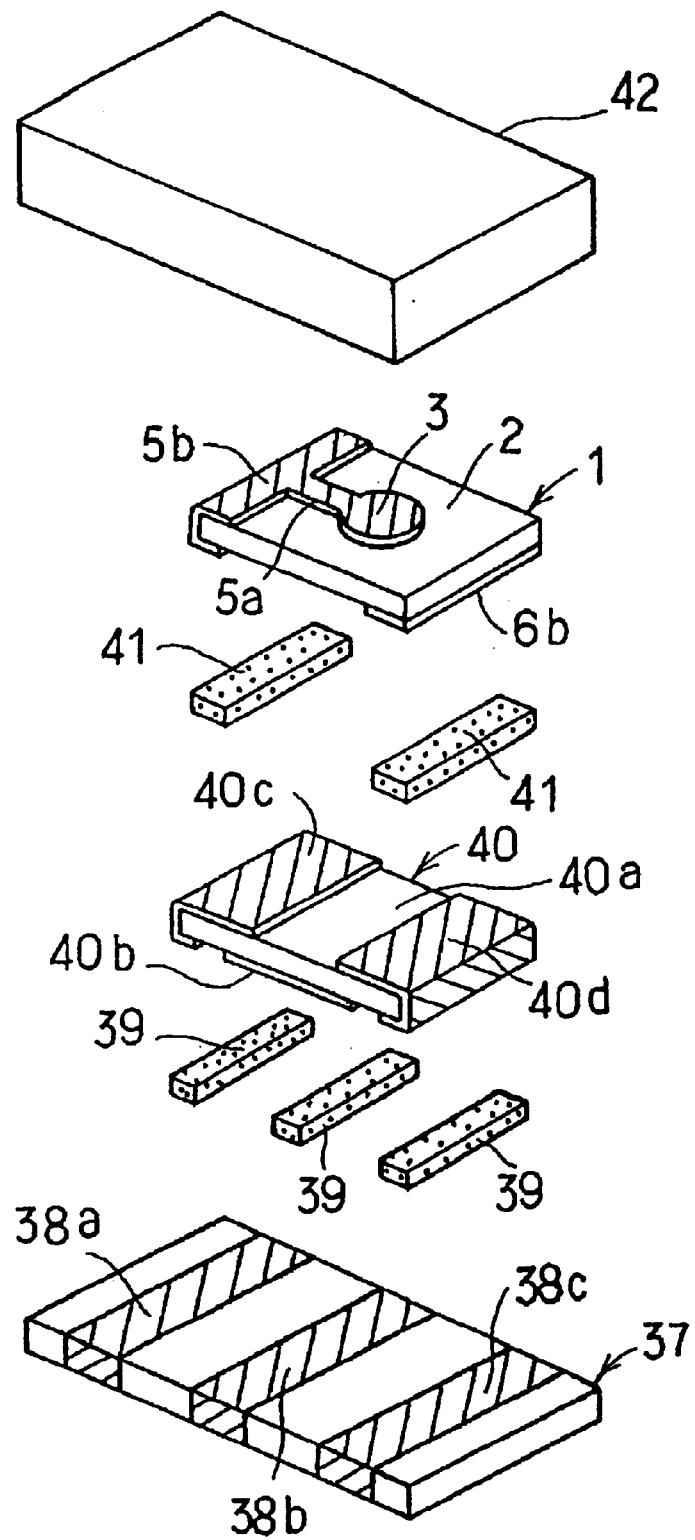
FIG. 14 is an exploded perspective view showing another modification of the energy-trap piezoelectric resonance component according to preferred embodiments of the present invention.

In a piezoelectric resonance component according to a modified preferred embodiment shown by an exploded perspective view of FIG. 14, a plate-shaped case member defining a lower substrate 37 is used. The lower substrate 37 is preferably made of an insulating ceramic or dielectric ceramic, and strip-shaped electrodes 38a to 38c are arranged to extend from the upper surface to the lower surface of the lower substrate 37 via the opposite side surfaces thereof. A three-terminal capacitor 40 is joined to the electrodes 38a to 38c via conductive adhesive layers 39.

The three-terminal capacitor 40 has a dielectric substrate 40a. A capacitor electrode 40b is disposed on the lower surface of the dielectric substrate 40a at the approximate center thereof. On the upper surface of the dielectric substrate 40a, a pair of capacitor electrodes 40c and 40d are arranged to face the capacitor electrode 40b with the dielectric substrate 40a disposed therebetween. The capacitor electrodes 40c and 40d extend to the lower surface of the dielectric substrate 40a via opposite end surfaces. Therefore, the capacitor electrodes 40a to 40c are respectively connected to the electrodes 38a to 38c via the adhesive layers 39.

The piezoelectric resonator 1 is joined and electrically connected to the capacitor electrodes 40c and 40d of the three-terminal capacitor 40 via conductive adhesive layers 41.

Subsequently, a metal cap 42 is joined to the lower substrate 37 which defines the case member, by use of insulating adhesive, such that the metal cap 42 surrounds the three-terminal capacitor 40 and the piezoelectric resonator 1.

Figure 15:
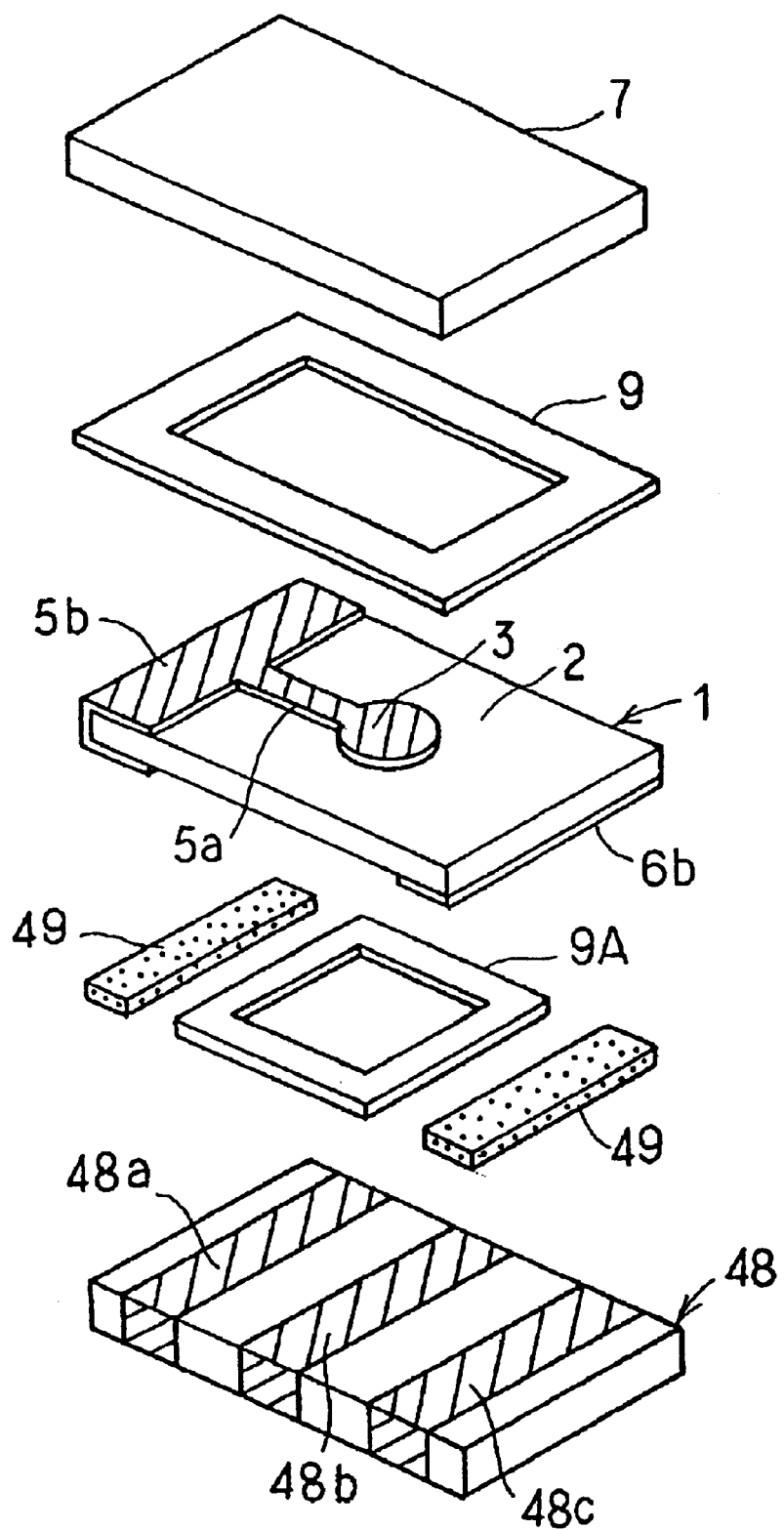
FIG. 15 is an exploded perspective view showing still another modification of the energy-trap piezoelectric resonance component according to preferred embodiments of the present invention.
Figure 16:
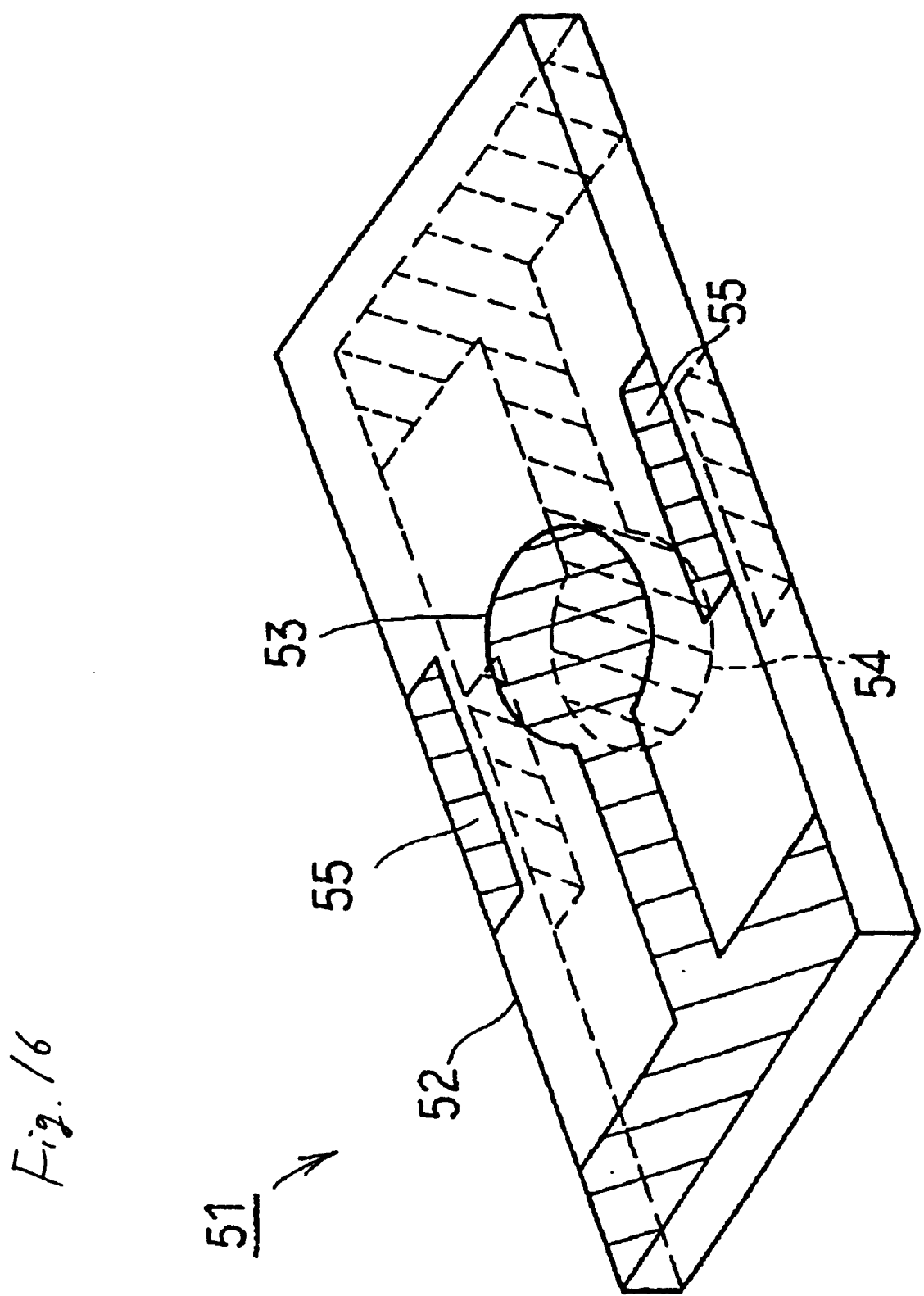
FIG. 16 is a perspective view of a conventional energy-trap piezoelectric resonator.

A piezoelectric resonance component shown in FIG. 15 is a modification of the piezoelectric resonance component shown in FIGS. 2A and 2B. In the present preferred embodiment, instead of the case substrate 8, a plate-shaped case substrate 48 preferably made of a dielectric ceramic is used. Strip-shaped electrodes 48a to 48c are arranged on the case substrate 48 such that the electrodes 48a to 48c extend from the upper surface to the lower surface of the case substrate 48 via opposite side surfaces thereof. A capacitor is formed between the electrodes 48a and 48b, while another capacitor is formed between the electrodes 48b and 48c.

Conductive adhesive layers 49 are used in order to electrically connect the electrodes 48a and 48c to the piezoelectric resonator 1. Therefore, an adhesive layer having a substantially rectangular-frame-like shape and used for bonding the piezoelectric substrate 1 to the case substrate 48 is arranged to be located between the conductive adhesive layers 49.

In the piezoelectric resonance component shown in FIG. 15, since the capacitor is constructed using the case substrate 48, a capacitor-built-in piezoelectric resonator can be constructed as in the case of the piezoelectric resonator shown in FIG. 14.

While the invention has been particularly shown and described with reference to preferred embodiments thereof, it will be understood by those skilled in the art that the forgoing and other changes in form and details may be made therein without departing from the spirit of the invention.

What is claimed is:

1. An energy-trap piezoelectric resonator, comprising:
a piezoelectric substrate having first and second main surfaces;
a first resonance electrode disposed on a portion of the first main surface of the piezoelectric substrate; and
a second resonance electrode disposed on a portion of the second main surface of the piezoelectric substrate, the second resonance electrode being arranged to face the first resonance electrode with the piezoelectric substrate disposed therebetween and having an external dimension smaller than that of the first resonance electrode;
wherein
each of the first and second main surfaces of the piezoelectric substrate has a substantially rectangular shape, and the first and second resonance electrodes are arranged such that a relationship of 1.00<(a)/(b)<1.25 is satisfied, where (a) is a dimension of the first electrode along a certain side of the substantially rectangular shape and (b) is a dimension of the second electrode along the certain side of the substantially rectangular shape.

2. The energy-trap piezoelectric resonator according to claim 1, wherein the resonator is constructed to use a third harmonic of thickness extensional vibration.

3. An energy-trap piezoelectric resonator comprising:
a piezoelectric substrate having first and second main surfaces;
a first resonance electrode disposed on a portion of the first main surface of the piezoelectric substrate; and
a second resonance electrode disposed on a portion of the second main surface of the piezoelectric substrate, the second resonance electrode being arranged to face the first resonance electrode with the piezoelectric substrate disposed therebetween and having an external dimension smaller than that of the first resonance electrode;
wherein
the first and second resonance electrodes have substantially circular shapes, and a relationship of 1.00<(a)/(b)<1.25 is satisfied, where (a) is a diameter of the first electrode and (b) is a diameter of the second electrode.

4. The energy-trap piezoelectric resonator according to claim 1, wherein the first and second resonance electrodes are located at the approximate center portion of the piezoelectric substrate.

5. The energy-trap piezoelectric resonator according to claim 1, wherein the piezoelectric substrate is polarized in the thickness direction thereof.

6. The energy-trap piezoelectric resonator according to claim 1, wherein the resonator is adapted to vibrate in a thickness extensional vibration mode.

7. An energy-trap piezoelectric resonance component, comprising:
a piezoelectric resonator including:
a piezoelectric substrate having first and second main surfaces;
a first resonance electrode disposed on a portion of the first main surface of the piezoelectric substrate; and
a second resonance electrode disposed on a portion of the second main surface of the piezoelectric substrate, the second resonance electrode being arranged to face the first resonance electrode with the piezoelectric substrate disposed therebetween and having an external dimension smaller than that of the first resonance electrode;
first and second case substrates which are layered respectively on the first and second main surfaces of the piezoelectric resonator such that the first and second case substrates sandwich the piezoelectric resonator and define a laminated body;
first and second terminal electrodes respectively disposed on opposite end surfaces of the laminated body and electrically connected to the first and second resonance electrodes; wherein a space is provided within the laminated body in order to allow free vibration of a vibration portion of the piezoelectric resonator where the first and second d resonance electrode being arranged to face the first resonance electrode with the piezoelectric substrate disposed therebetween and having an external dimension smaller than that of the first resonance electrode;

first and second case substrates which are layered respectively on the first and second main surfaces of the piezoelectric resonator such that the first and second case substrates sandwich the piezoelectric resonator and define a laminated body;

first and second terminal electrodes respectively disposed on opposite end surfaces of the laminated body and electrically connected to the first and second resonance electrodes; wherein a space is provided within the laminated body in order to allow free vibration of a vibration portion of the piezoelectric resonator where the first and second resonance electrodes face each other; and each of the first and second main surfaces of the piezoelectric substrate has a substantially rectangular shape, and the first and second resonance electrodes are arranged such that a relationship of 1.00<(a)/(b)<1.25 is satisfied, where (a) is a dimension of the first electrode along a certain side of the substantially rectangular shape and (b) is a dimension of the second electrode along the certain side of the substantially rectangular shape.

8. The energy-trap piezoelectric resonance component according to claim 7, wherein the resonator is constructed to use a third harmonic of thickness extensional vibration.

9. An energy-trap piezoelectric resonance component, comprising:

a piezoelectric resonator including:
a piezoelectric substrate having first and second main surfaces;
a first resonance electrode disposed on a portion of the first main surface of the piezoelectric substrate; and
a second resonance electrode disposed on a portion of the second main surface of the piezoelectric substrate, the second resonance electrode being arranged to face the first resonance electrode with the piezoelectric substrate disposed therebetween and having an external dimension smaller than that of the first resonance electrode;

first and second case substrates which are layered respectively on the first and second main surfaces of the piezoelectric resonator such that the first and second case substrates sandwich the piezoelectric resonator and define a laminated body;

first and second terminal electrodes respectively disposed on opposite end surfaces of the laminated body and electrically connected to the first and second resonance electrodes; wherein a space is provided within the laminated body in order to allow free vibration of a vibration portion of the piezoelectric resonator where the first and second d resonance electrode being arranged to face the first resonance electrode with the piezoelectric substrate disposed therebetween and having an external dimension smaller than that of the first resonance electrode;

first and second case substrates which are layered respectively on the first and second main surfaces of the piezoelectric resonator such that the first and second case substrates sandwich the piezoelectric resonator and define a laminated body;

first and second terminal electrodes respectively disposed on opposite end surfaces of the laminated body and electrically connected to the first and second resonance electrodes; wherein a space is provided within the laminated body in order to allow free vibration of a vibration portion of the piezoelectric resonator where the first and second resonance electrodes face each other; and the first and second resonance electrodes have substantially circular shapes, and a relationship of 1.00<(a)/(b)<1.25 is satisfied, where (a) is a diameter of the first electrode and (b) is a diameter of the second electrode.

10. The energy-trap piezoelectric resonance component according to claim 7, wherein the first and second resonance electrodes are located at the approximate center portion of the piezoelectric substrate.

11. The energy-trap piezoelectric resonance component according to claim 7, wherein the piezoelectric substrate is polarized in the thickness direction thereof.

12. The energy-trap piezoelectric resonance component according to claim 7, wherein the resonator is adapted to vibrate in a thickness extensional vibration mode.

13. An energy-trap piezoelectric resonance component, comprising:

a piezoelectric resonator including:
a piezoelectric substrate polarized in the thickness direction thereof and having first and second main surfaces;
a first resonance electrode disposed on a portion of the first main surface of the piezoelectric substrate; and
a second resonance electrode disposed on a portion of the second main surface of the piezoelectric substrate, the second resonance electrode being arranged to face the first resonance electrode with the piezoelectric substrate disposed therebetween and having an external dimension smaller than that of the first resonance electrode; and a case accommodating the piezoelectric resonator, the case including a case body having an opening on one surface and supporting the piezoelectric resonator therein, and a plate-shaped case member fixed to the case body and arranged to close the opening of the case body; wherein each of the first and second main surfaces of the piezoelectric substrate has a substantially rectangular shape, and the first and second resonance electrodes are arranged such that a relationship of 1.00<(a)/(b)<1.25 is satisfied, where (a) is a dimension of the first electrode along a certain side of the substantially rectangular shape and (b) is a dimension of the second electrode along the certain side of the substantially rectangular shape.

14. The energy-trap piezoelectric resonance component according to claim 13, wherein the resonator is constructed to use a third harmonic of thickness extensional vibration.

15. An energy-trap piezoelectric resonance component, comprising:

a piezoelectric resonator including:
a piezoelectric substrate polarized in the thickness direction thereof and having first and second main surfaces;
a first resonance electrode disposed on a portion of the first main surface of the piezoelectric substrate; and a second resonance electrode disposed on a portion of the second main surface of the piezoelectric substrate, the second resonance electrode being arranged to face the first resonance electrode with the piezoelectric substrate disposed therebetween and having an external dimension smaller than that of the first resonance electrode; and a case accommodating the piezoelectric resonator, the case including a case body having an opening on one surface and supporting the piezoelectric resonator therein, and a plate-shaped case member fixed to the case body and arranged to close the opening of the case body; wherein the first and second resonance electrodes have substantially circular shapes, and a relationship of $1.00<(a)/(b)<1.25$ is satisfied, where (a) is a diameter of the first electrode and (b) is a diameter of the second electrode.

16. The energy-trap piezoelectric resonance component according to claim 13, wherein the first and second resonance electrodes are located at the approximate center portion of the piezoelectric substrate.

17. The energy-trap piezoelectric resonance component according to claim 13, wherein the resonator is adapted to vibrate in a thickness extensional vibration mode.

* * * * *